(12) United States Patent
Kim

(10) Patent No.: US 12,002,849 B2
(45) Date of Patent: Jun. 4, 2024

(54) SUPER JUNCTION SEMICONDUCTOR DEVICE AND METHOD OF MANUFACTURING THE SAME

(71) Applicant: DB HITEK CO., LTD., Seoul (KR)

(72) Inventor: Jong Min Kim, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 17/389,887

(22) Filed: Jul. 30, 2021

(65) Prior Publication Data
US 2022/0037463 A1 Feb. 3, 2022

(30) Foreign Application Priority Data
Jul. 31, 2020 (KR) .......................... 10-2020-0096044

(51) Int. Cl.
| | |
|---|---|
| *H01L 29/06* | (2006.01) |
| *H01L 29/40* | (2006.01) |
| *H01L 29/423* | (2006.01) |
| *H01L 29/66* | (2006.01) |
| *H01L 29/78* | (2006.01) |

(52) U.S. Cl.
CPC ...... *H01L 29/0634* (2013.01); *H01L 29/0615* (2013.01); *H01L 29/0619* (2013.01); *H01L 29/402* (2013.01); *H01L 29/4236* (2013.01); *H01L 29/66712* (2013.01); *H01L 29/7811* (2013.01)

(58) Field of Classification Search
CPC ............. H01L 29/0634; H01L 29/0619; H01L 29/0615; H01L 29/7811
See application file for complete search history.

(56) References Cited

U.S. PATENT DOCUMENTS 9,954,056 B2\* 4/2018 Hirler ................. H01L 29/0696
2021/0074808 A1\* 3/2021 Nishimura ........ H01L 29/66734

FOREIGN PATENT DOCUMENTS

JP  2018041853 A  *  3/2018  ....... H01L 21/26513

OTHER PUBLICATIONS

JP-2018041853-A and machine translation (Year: 2022).*

\* cited by examiner

*Primary Examiner* — Bilkis Jahan
*Assistant Examiner* — Victor V Barzykin
(74) *Attorney, Agent, or Firm* — Husch Blackwell LLP

(57) ABSTRACT

A super junction semiconductor device includes a substrate of a first conductive type, the substrate including an active region, a peripheral region surrounding the active region and a transition region interposed between the active region and the peripheral region, an epitaxial layer disposed on the substrate, the epitaxial layer having a the first conductive type, a plurality of pillars extending in a vertical direction and arranged within the epitaxial layer, gate structures disposed on the epitaxial layer in both the active region and the transition region, and the each of the gate structures extending across the epitaxial layer and the pillars in a horizontal direction, and a reverse recovery layer of a second conductive type, the reverse recovery layer having a vertical formation heights different as between on the pillars and on the epitaxial layer, the reverse recovery layer configured to dissipate a reverse recovery current in the transition layer.

12 Claims, 7 Drawing Sheets

SUPER JUNCTION SEMICONDUCTOR DEVICE AND METHOD OF MANUFACTURING THE SAME

CROSS-REFERENCE TO RELATED APPLICATION

This application claims priority to Korean Patent Application No. 10-2020-0096044, filed on Jul. 31, 2020, and all the benefits accruing therefrom under 35 U.S.C. § 119, the contents of which are incorporated by reference in their entirety.

TECHNICAL FIELD

The present disclosure relates to a super junction semiconductor device and a method of manufacturing the same, and more particularly, to a super junction semiconductor device including a metal oxide semiconductor field effect transistor (hereinafter, referred to as MOSFET) and a method of manufacturing the super junction semiconductor device.

BACKGROUND

Generally, a super junction semiconductor device having a super junction structure has been widely used in order to improve a trade-off relation between forward characteristics and reverse characteristics in a power semiconductor device.

The super junction semiconductor device includes a plurality of N-type pillars spaced apart from each other and a plurality of P-type pillars spaced apart from each other to be alternatively arranged, a P-body region, a plurality of gate structures and a termination ring entirely surrounding an active region to define a peripheral region. Therefore, the super junction semiconductor device has a relatively low on-resistance $R_{sp}$ to decrease a size of the semiconductor device. As a result, the super junction semiconductor device has a reduced capacitance to improve the switching characteristics thereof.

However, in the super junction semiconductor device, a parasitic P-body diode is formed between the P-body region and the N-type pillar. When the P-body diode is switched from an on-state to an off-state, a reverse recovery phenomenon may occur. When the reverse recovery phenomenon occurs, minority carriers are removed in the P-body diode to generate a reverse recovery current Isd. In this case, the reverse recovery (dt/di) may cause a relatively high voltage overshoot due to the stray capacitance. As a result, an increase in an amount of gate-drain charge and a current concentration may occur. In particular, the reverse recovery phenomenon may occur in a transition region between the active region and the peripheral region.

In order to suppress the reverse recovery phenomenon, a reverse recovery layer may be formed in the transition region to effectively dissipate the reverse recovery current.

However, the reverse recovery layer may have a problem of reducing the effective length of the N-type pillar. Accordingly, the breakdown voltage (BV) of the peripheral region may be seriously reduced. Accordingly, as the difference between the breakdown voltage of the active region and the breakdown voltage of the peripheral region increases, the active region reaches to the breakdown voltage and damage may occur in the peripheral region before processing the transient current.

SUMMARY

The example embodiments of the present disclosure provide a super junction semiconductor device capable of suppressing an effective length of a pillar from decreasing as well as dissipating a reverse recovery current.

The example embodiments of the present disclosure provide a method of manufacturing a super junction semiconductor device capable of suppressing an effective length of a pillar from decreasing as well as dissipating a reverse recovery current.

According to an example embodiment of the present disclosure, a super junction semiconductor device includes a substrate of a first conductive type, the substrate including an active region, a peripheral region surrounding the active region and a transition region interposed between the active region and the peripheral region, an epitaxial layer disposed on a substrate, the epitaxial layer having a the first conductive type, a plurality of pillars extending in a vertical direction and being formed inside of the epitaxial layer, gate structures disposed on the epitaxial layer in both the active region and the transition region, and the each of the gate structures crossing the epitaxial layer and the pillars to extend in a horizontal direction, and a reverse recovery layer of a second conductive type, having vertical formation heights different between on the pillars and on the epitaxial layer, the reverse recovery layer being configured to dissipate a reverse recovery current in the transition layer.

In an example embodiment, the reverse recovery layer may include a first reverse recovery layer pattern formed under each of the gate structures and a second reverse recovery layer pattern formed between the gate structures adjacent to each other.

Here, the first and second reverse recovery layer patterns may have vertical formation heights different from each other, and the reverse recovery layer has a step shape as a whole.

In an example embodiment, a diffusion region of the second conductive type may be further provided to cover the second reverse recovery layer pattern.

Here, the second reverse recovery layer pattern may have a vertical depth lower than that of the diffusion region.

Further, the second reverse recovery layer pattern may have an ion concentration higher than that of the diffusion region.

In an example embodiment, a field oxide layer is further disposed in the peripheral region, and wherein the reverse recovery layer is disposed both under the field oxide layer and over the epitaxial layer.

In an example embodiment, the gate structure may include a gate insulating layer extending in the horizontal direction to cross the pillars, a gate electrode formed on the gate insulating layer and an insulating interlayer covering the gate electrode.

According to an example embodiment of the present disclosure, a method of manufacturing a super junction semiconductor device is disclosed. The method includes preparing a substrate of a first conductive type, the substrate including an active region, a peripheral region surrounding the active region and a transition region interposed between the active region and the peripheral region, forming an epitaxial layer of the first conductive type on the substrate, forming a plurality of pillars of a second conductive type, the pillars extending in a vertical direction, being formed inside of the epitaxial layer and being alternatively arranged in a horizontal direction, forming gate structures on the epitaxial layer in both the active region and the transition region, and the each of the gate structures crossing the epitaxial layer and the pillars to extend in a horizontal direction and performing an ion implanting process using the gate structures in the transition region as masks to form a reverse recovery layer of a second conductive type, the reverse recovery layer having vertical formation heights different between on the pillars and on the epitaxial layer, the reverse recovery layer being configured to dissipate a reverse recovery current in the transition layer.

In an example embodiment, a field oxide layer is further formed in the peripheral region, and wherein the reverse recovery layer is disposed both under the field oxide layer and over the epitaxial layer.

In an example embodiment, forming the reverse recovery layer may include forming a first reverse recovery layer pattern under each of the gate structures and a second reverse recovery layer pattern between the gate structures adjacent to each other.

Here, the first and second reverse recovery layer patterns may have vertical formation heights different from each other, and the reverse recovery layer has a step shape as a whole.

In an example embodiment, prior to forming the reverse recovery layer, a diffusion region of the second conductive type may be further formed.

Here, the second reverse recovery layer pattern may have a vertical depth lower than that that of the diffusion region.

Further, the reverse recovery layer may have an ion concentration higher than that of the diffusion region.

According to example embodiments of the super junction semiconductor device and the method of manufacturing the super junction semiconductor device, the reverse recovery layer of the second conductivity type is provided to have vertical heights different between over the pillars and over epitaxial layer in a transition region to dissipate a reverse recovery current. Accordingly, when the reverse recovery current Isd is concentrated on the boundary region between the transition region TR and the peripheral region PR, the reverse recovery layer is formed in the transition region TR through which the reverse recovery current Isd may flow to reduce resistance. Therefore a burnt phenomenon around the boundary region can be suppressed as the increase in a lattice temperature is suppressed.

Furthermore, the effective length of which the epitaxial layer is interposed between the transition pillars may be suppressed from decreasing. In addition, as the epitaxial layer of the active region AR and the transition epitaxial layer of the transition region TR have junction structures identical to each other, a difference in potential line between the active region AR and the transition region TR is decreased As a result, while the reverse recovery phenomenon occurs, the active region AR reaches to the breakdown voltage to process the transient current, so that the impact on the transition region TR or the peripheral region PR may be reduced.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Figure 1:
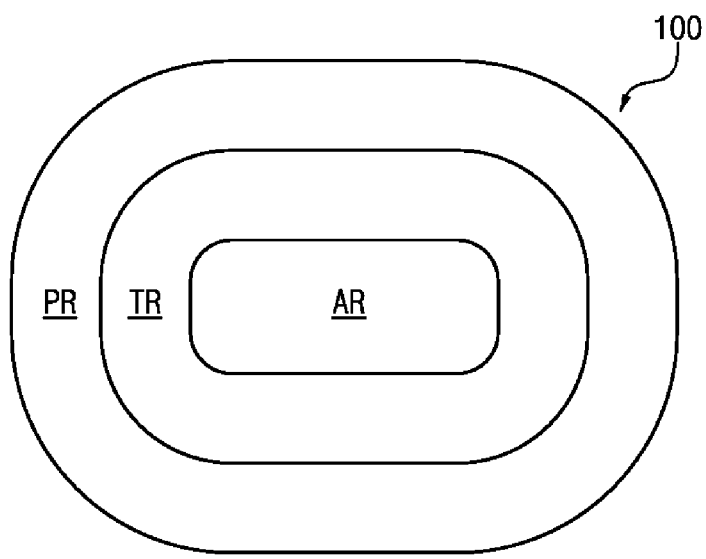
FIG. 1 is a plan view illustrating a super junction semiconductor device in accordance with an example embodiment of the present disclosure.

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, regions, or plates may also be present. By contrast, it will also be understood that when a layer, a film, a region or a plate is referred to as being 'directly on' another one, it is directly on the other one, and one or more intervening layers, films, regions or plates do not exist. Also, though terms such as a first, a second, and a third are used to describe various components, compositions, regions, films, and layers in various embodiments of the present disclosure, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations. As used throughout the description and the claims, "above" and "below" refer to a device as oriented in the drawings. That is, "bottom" or "below" or "under" refers to the portions that are towards the bottom of the page and towards the unaltered substrate portion, whereas "top" or "over" or "above" refers to the portions that are towards the top of the page (that is, towards the portion of the structures that is operated upon with various treatments to form the electrically active components thereof). Such terms are used either on an absolute basis or relative to other components, and the meaning of such relative terminology will be understood in reference to the drawings.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. The Figures are not necessarily drawn to scale. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present invention.

Figure 2:
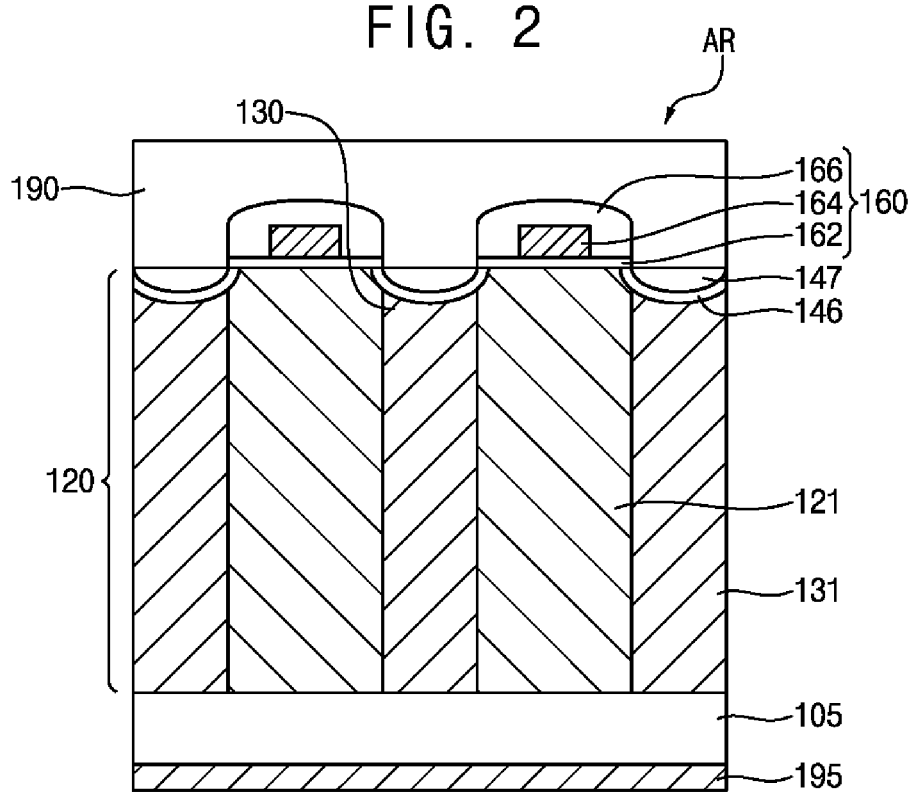
FIG. 2 is a cross sectional view illustrating an active region AR in FIG. 1.
Figure 3:
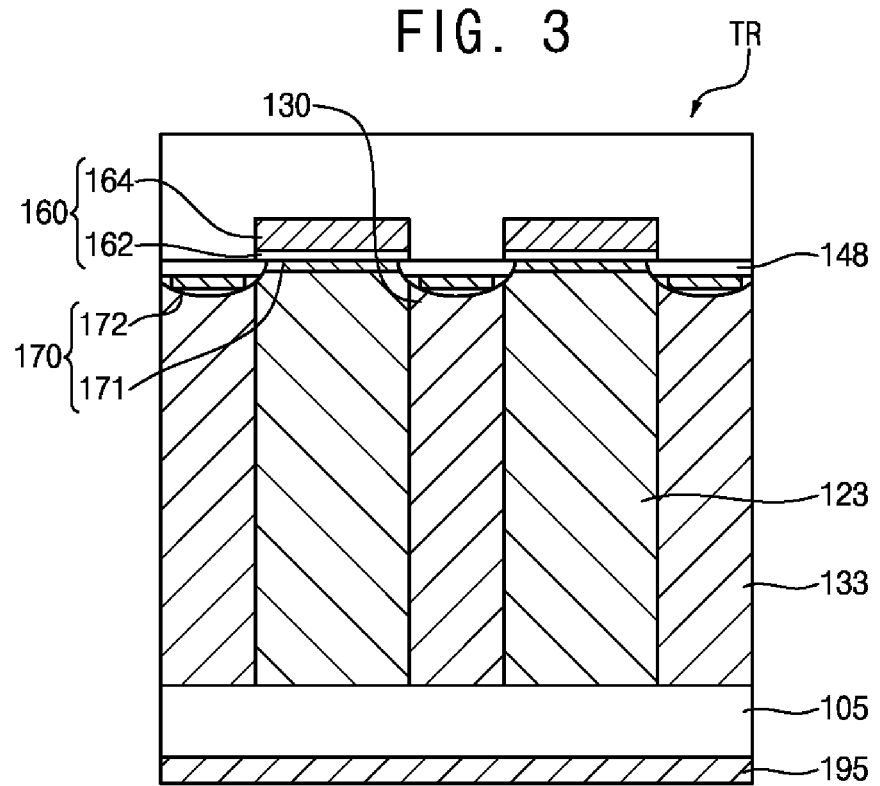
FIG. 3 is a cross sectional view illustrating a transition region TR in FIG. 1.
Figure 4:
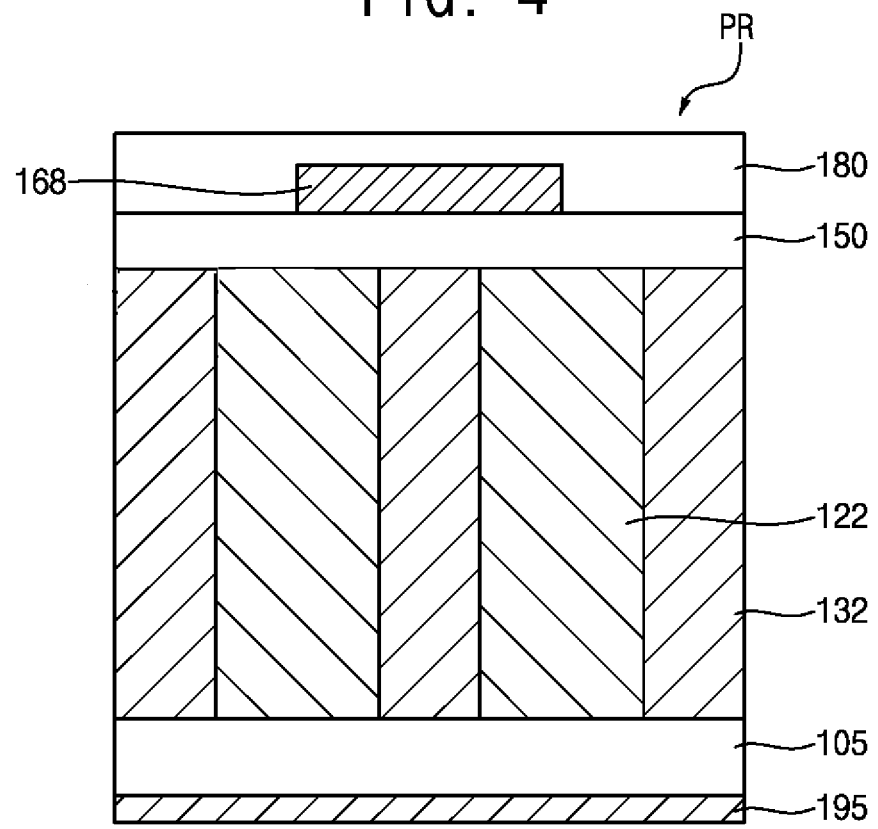
FIG. 4 is a cross sectional view illustrating a peripheral region PR in FIG. 1.

FIG. 1 is a plan view illustrating a super junction semiconductor device in accordance with an example embodiment of the present disclosure. FIG. 2 is a cross sectional view illustrating an active region AR in FIG. 1. FIG. 3 is a cross sectional view illustrating a transition region TR in FIG. 1. FIG. 4 is a cross sectional view illustrating a peripheral region PR in FIG. 1.

Referring to FIGS. 1 to 4, a super junction semiconductor device 100 in accordance with an example embodiment of the present disclosure includes a substrate 105, an epitaxial layer 120, a plurality of pillars 130, a reverse recovery layer 170 and a source electrode 170.

The substrate 105 may include a silicon substrate. The substrate 105 has a first conductive type, for example, a high concentration conductive N+ type.

The substrate 105 is divided into an active region AR, a peripheral region PR, and a transition region TR. The active region AR is disposed in a central portion of the semiconductor device. A power MOSFET is formed in the active region AR. The peripheral region PR is provided to surround the active region AR. Meanwhile, the transition region TR is defined as a boundary region between the active region AR and the peripheral region PR.

The epitaxial layer 120 has the first conductive type, for example, a low concentration conductive N-type. The epitaxial layer 120 may be formed from the substrate 105 by an epitaxial growth process. The epitaxial layer 120 is formed over an entire upper portion of the substrate 105 including the active region AR, the peripheral region PR, and the transition region TR.

The pillars 130 extend in a vertical direction inside the epitaxial layer 120, respectively. The pillars 130 may be formed to vertically penetrate the epitaxial layer 120. The pillars 130 may have a second conductivity type. That is, when the epitaxial layer 120 has an n-type conductivity, the pillar 130 may have a p-type conductivity.

Alternatively, the epitaxial layer 120 interposed between the fillers having the second conductivity type may function as a pillar of the first conductivity type.

Also, when viewed in a plan view, the pillars 130 may have a stripe shape. Alternatively, the pillars 130 may have a polygonal shape such as a hexagonal shape.

The pillars 130 are formed entirely over the substrate 105 including the active region AR, the transition region TR, and the peripheral region PR. That is, the pillars 130 include active pillars 131 provided in the active region AR, transition pillars 132 provided in the transition region TR, and peripheral pillars 133 provided in the peripheral region PR.

Also, the pillars 130 may be alternately arranged in a horizontal direction. That is, the pillar 130 are arranged to be spaced apart from each other in the horizontal direction. Accordingly, the pillars 130 and the epitaxial layer 130 may be alternately arranged with each other.

A P-body region 146 is provided at an upper portion of the active pillars 131. In addition, a high concentration region 147 of the second conductivity type is provided in the upper portion of the P-body region 146. Accordingly, since the P-body region 146 and the high concentration region 147 have relatively low resistance, an electrical connection between the active pillars 131 and the source electrode 190 may be stably secured.

Referring to FIGS. 1 to 3 again, a gate structure 160 is provided on the epitaxial layer 121 in the transition region TR as well as in the active region AR. The gate structure 160 formed in the active region extends in a horizontal direction across the active epitaxial layer 121 and the active pillars 131. The gate structure 160 may have a stripe shape. When a plurality of gate structures 160 is provided, the gate structures 160 are arranged to be spaced apart from each other.

Meanwhile, in a plan view, when each of the active epitaxial layers 121 has a hexagonal shape, the gate structure 160 is positioned to pass between the active epitaxial layers 121 adjacent to each other.

Since the gate structure 160 has a stripe shape, a width of the gate structure 160 is relatively narrow, so that the super-junction semiconductor device 100 may have reduced input capacitance.

The gate structure 160 formed in the active region includes a gate insulating layer 162, a gate electrode 164, and a hard mask layer 166.

The gate insulating layer 162 is provided to pass above the active epitaxial layers 121. An example of the gate insulating layer 162 may include a silicon oxide layer.

The gate electrode 164 is positioned on the gate insulating layer 162. A width of the gate electrode 164 may be narrower than the width of the gate insulating layer 162. An example of the gate electrode 164 may include polysilicon material.

The hard mask layer 166 is provided to cover the gate electrode 164 and the gate insulating layer 162. The hard mask layer 166 electrically insulates the gate electrode 164 and the source electrode 170 from each other. An example of the hard mask layer 166 includes a nitride layer.

Although not shown, the gate structure 160 may have a trench structure. In this case, the gate structure 160 is formed to extend into the active epitaxial layer 121. Since a gap between the active pillars 131 may be reduced, forward characteristics may be improved according to the improvement in the degree of integration of the super-junction semiconductor device 100.

Referring to FIG. 3 again, the gate structure 160 is also formed in the transition region TR. The gate electrode 164 and the gate insulating layer 162 included in the gate structure 160 are provided on the epitaxial layer 123. The gate structure 160 formed in the transition region TR may have an electrically floating state. Accordingly, the gate electrode 164 formed in the transition region TR may correspond to a dummy electrode.

The reverse recovery layer 170 is located in the transition region TR. The reverse recovery layer 170 is provided to distribute a reverse recovery current.

That is, when the super junction semiconductor device 100 is switched from an on-state to an off-state, a reverse recovery phenomenon may occur. In particular, the reverse recovery phenomenon occurs at the transition region TR. When a reverse recovery current Isd may be concentrated in a boundary region between the transition region TR and the peripheral region PR, the reverse recovery layer 170 formed in the transition region TR through which the reverse recovery current Isd may flow may reduce a resistance value of the reverse recovery current Isd. Thus, the reverse recovery layer 170 may suppress the lattice temperature from increasing. As a result, a burnt phenomenon around the boundary region may be suppressed.

The reverse recovery layer 170 is formed on the transition pillars 133 and on the transition epitaxial layer 123. The reverse recovery layer 170 includes one portion 171 formed on the transition pillars 133 and the other portion formed on the transition epitaxial layer 123 which have vertical heights different from each other. For example, the one portion 171 of the reverse recovery layer 170 is interposed between the gate structure 160 and the epitaxial layer 123. In addition, the other portion 172 of the reverse recovery layer 170 is positioned between the gate structures 160 adjacent to each other and over the transition pillars 133. In this case, the one portion 171 of the reverse recovery layer is formed higher in the vertical direction than the other portions 172 of the reverse recovery layer. That is, when the reverse recovery layer 170 is formed through an ion implantation process, the one portion 171 of the reverse recovery layer 170 is formed to have a shallow depth.

Accordingly, the epitaxial layer 123 interposed between the transition pillars 133 adjacent to each other may be suppressed from decreasing in an effective length thereof. Further, since the epitaxial layer 121 of the active region AR and the transition epitaxial layer 123 of the transition region TR have a junction structure identical to each other, difference in values of the potential lines between the active region AR and the transition region TR may be reduced. As a result, while the reverse recovery phenomenon occurs, the active region AR reaches to the breakdown voltage to handle a transient current, so that an impact on the transition region TR or the peripheral region PR may be reduced.

The reverse recovery layer 170 may have a second conductivity type, for example, a P-type conductivity. The reverse recovery layer 170 may be formed by ion implantation of an impurity element such as a group III element, for example, boron, gallium, or indium. In this case, in the ion implantation process, the reverse recovery layer 170 may be adjusted to have various profiles by changing a processing time, an ion implantation amount, or an ion implantation energy conditions.

Meanwhile, in the ion implantation process, the gate structure 160 may function as an ion implantation mask. Accordingly, by adjusting the thickness of the gate structure 160, the reverse recovery layer 170 may adjust a formation position thereof along the vertical direction.

Referring to FIG. 3, the reverse recovery layer 170 includes a first reverse recovery layer pattern 171 formed on the transition pillar 133 and a second reverse recovery layer pattern 172 formed on the epitaxial layer 123. The first reverse recovery layer pattern 171 and the second reverse recovery layer pattern 172 have different vertical heights. For example, the first reverse recovery layer pattern 171 is interposed between the gate structure 160 and the transition epitaxial layer 123. In addition, the second reverse recovery layer pattern 172 is positioned between the gate structures 160 adjacent to each other and on the transition pillars 133. The first reverse recovery layer pattern 171 has a vertical position higher than that of the second reverse recovery layer pattern 172. The first reverse recovery layer pattern 171 may be formed to have a shallow depth.

Accordingly, as the first and second reverse recovery layer patterns 171 and 172 have vertical heights different from each other, the reverse recovery layer 170 may have a step shape as a whole.

A diffusion region 148 may be additionally provided in the transition region TR and over the transition pillar 133. A horizontal end portion of the diffusion region 148 may be bridged to the first active pillar 131 of the active region AR. Accordingly, the diffusion region 148 may connect the transition pillars 133 in the transition region TR to one of the active pillars 131 provided in the active region AR. As a result, the transition pillar 133 may be connected to the source electrode 190 via the diffusion region 148 and the active pillar 131.

The diffusion region 148 in the transition region TR may have a doping concentration similar to that of the P-body region 146 in the active region. The diffusion region 148 in the transition region TR may have the second conductivity type as the P-body region 146 in the active region has.

In this case, the diffusion region 148 may be provided to cover the second reverse recovery layer pattern 172. Also, the second reverse recovery layer pattern 172 may be positioned under the diffusion region 148.

Meanwhile, the reverse recovery layer 170 may have the ion concentration higher than that of the diffusion region 148. Accordingly, when the reverse recovery current Isd flows, the reverse recovery layer 170 formed in the transition region TR may effectively makes a resistance of the reverse recovery current lower.

Referring back to FIG. 4, a field oxide layer 150 is provided in the peripheral region PR. That is, the field oxide layer 150 may define a peripheral region PR. The field oxide layer 150 may be formed by oxidizing the epitaxial layer 120 to electrically isolate the active region AR from the peripheral region PR.

A field plate electrode 168 is formed on the field oxide layer 150. The field plate electrode 168 may electrically have a floating state. Accordingly, the field plate electrode 168 is also referred to as a dummy electrode.

The field plate electrode 168 may be made of, for example, a polysilicon material. Meanwhile, a surface passivation layer 180 covering the field plate electrode 168 is formed.

Meanwhile, as described above, the peripheral epitaxial layers 122 and the peripheral pillars 132 extend in the vertical direction and in the peripheral region PR. In addition, the peripheral epitaxial layers 122 and the peripheral pillars 132 may be alternately arranged.

As the field plate electrode 168 is provided in the peripheral region PR, the super-junction semiconductor device 100 may have improved withstand voltage characteristics by reducing electric field concentration and further increasing the breakdown voltage.

Referring back to FIGS. 1 and 2, the source electrode 190 is provided to cover the gate structure 160 on the epitaxial layer 120. Meanwhile, a drain electrode 195 is formed on the lower surface of the substrate 110.

FIGS. 5 to 11 are cross sectional views illustrating a method of manufacturing a super junction semiconductor device in accordance with an example embodiment of the present disclosure.

Figure 5:
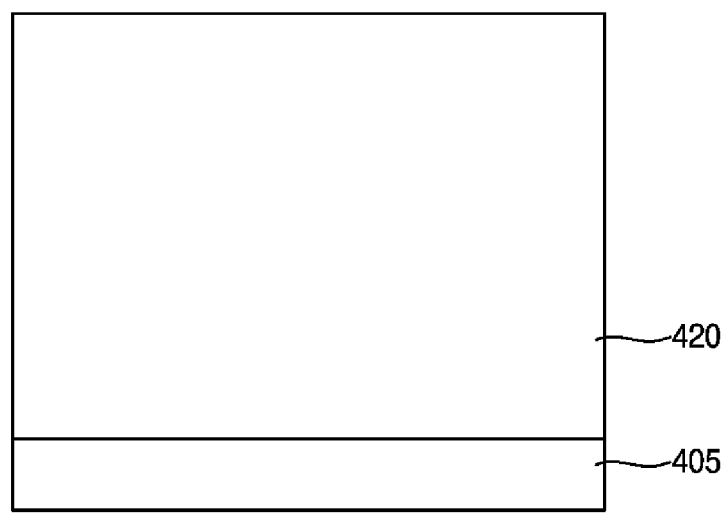
FIGS. 5 to 12 are cross sectional views illustrating a method of manufacturing a super junction semiconductor device in accordance with an example embodiment of the present disclosure.

Referring to FIG. 5, an epitaxial layer 420 of a first conductivity type is formed on a substrate 405 of the first conductivity type. The epitaxial layer 420 is formed through an epitaxial process on the first conductivity-type substrate 405.

Figure 6:
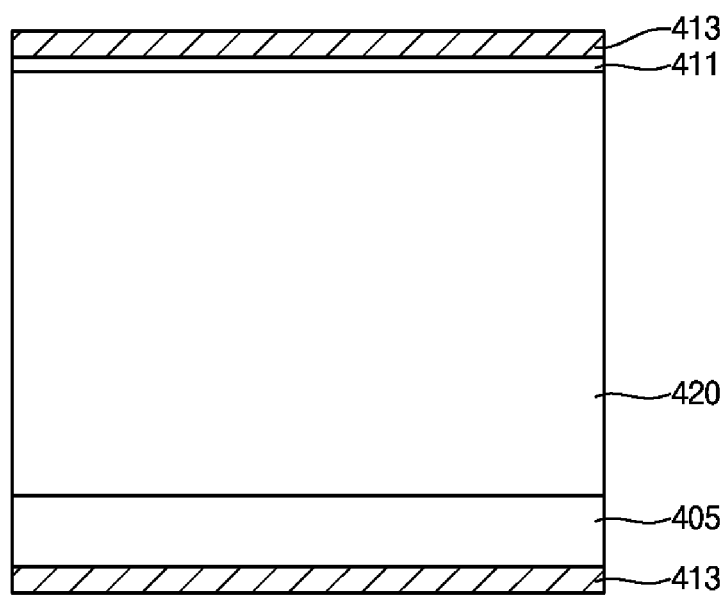

Referring to FIG. 6, a buffer oxide layer 411 is formed on the epitaxial layer 420. Subsequently, a polysilicon layer 413 is formed on the buffer oxide layer 411. In this case, the buffer oxide layer 411 may protect the upper portion of the epitaxial layer 420 in a subsequent process of forming the polysilicon layer.

Figure 7:
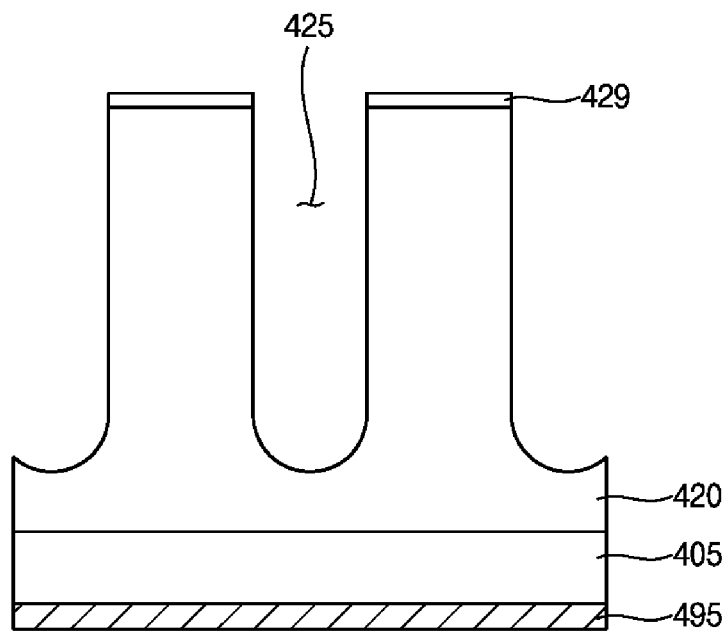

Referring to FIG. 7, the polysilicon layer 413 and the buffer oxide layer 411 formed on the upper surface of the substrate 405 are removed from the substrate 405. For this purpose, a chemical mechanical polishing process is performed.

Then, trenches 425 vertically recessing the inside of the epitaxial layer 420 are formed. In this case, a silicon etching process using a conventional etching mask 429 may be performed to form the trenches 425.

Figure 8:
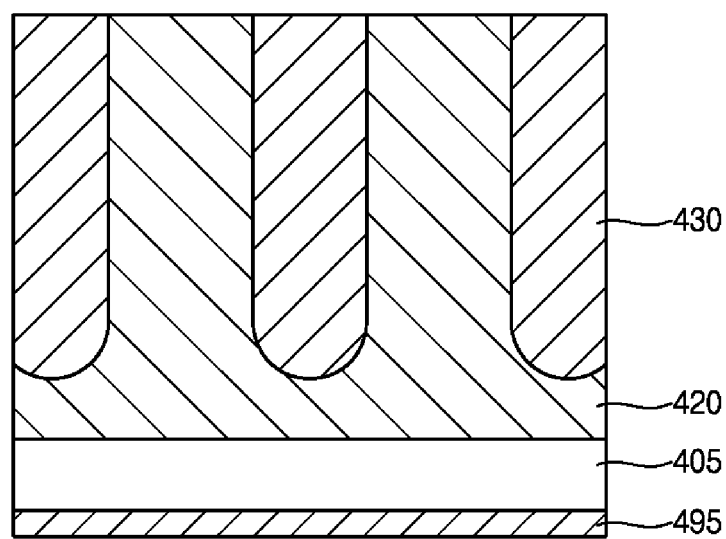

Referring to FIG. 8, the trenches 425 are filled with epitaxial silicon material, and a post-baking process is further performed. Then, it is performed to planarize the silicon layer surface. Accordingly, pillars 430 are formed in the trenches 425. The pillars 430 may be formed to have a second conductivity type.

Alternatively, sub-pillars (not shown) are formed through an ion implantation process while forming a plurality of epitaxial layers on the substrate. Accordingly, a plurality of sub-pillars is vertically stacked to form the pillars including the sub-pillars vertically stacked.

Figure 9:
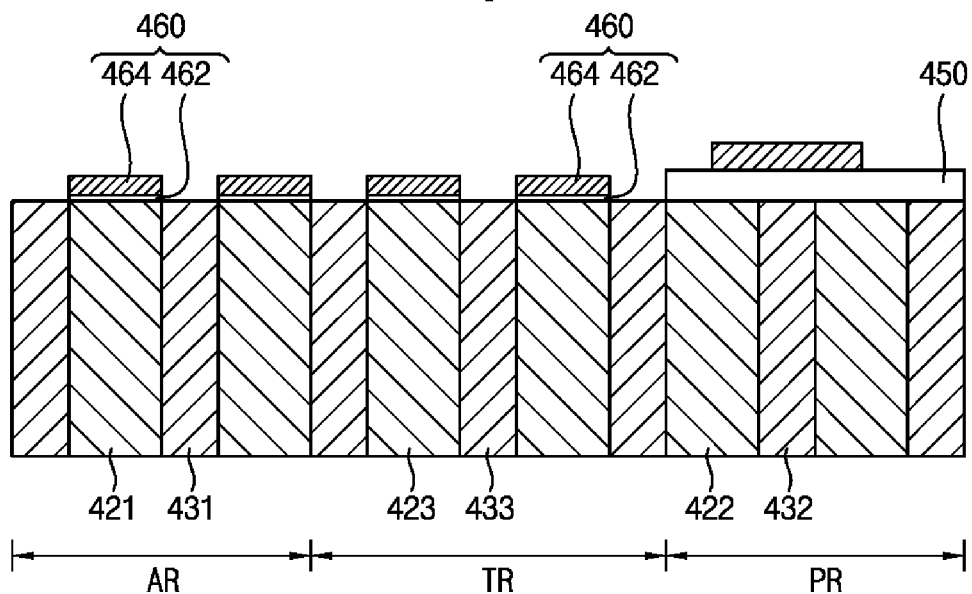

Referring to FIG. 9, a field oxide layer 450 is formed in a peripheral region PR. The field oxide layer 450 may be formed through an oxidation process of oxidizing upper portions of the pillars 430 and the epitaxial layer 420 formed in the peripheral region PR.

Next, a gate oxide layer 462 and a gate electrode 464 made of gate polysilicon are formed using known techniques. Accordingly, the gate structure 460 is formed. In this case, the gate structure 460 is formed not only in an active region AR but also in a transition region TR corresponding to a boundary region between the active region AR and the peripheral region PR.

Figure 10:
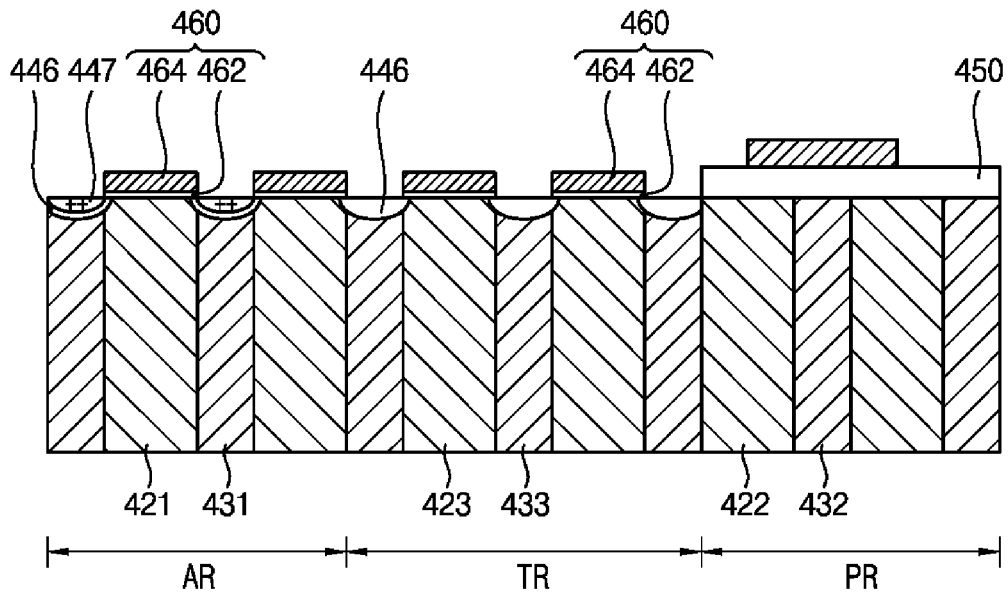

Referring to FIG. 10, a first ion implantation process is performed using the gate structure 460 formed in the active region AR as an ion implantation mask. Thereafter, the P-body region 446 is formed in the active region AR through a relatively high temperature annealing process (diffusion process).

Figure 11:
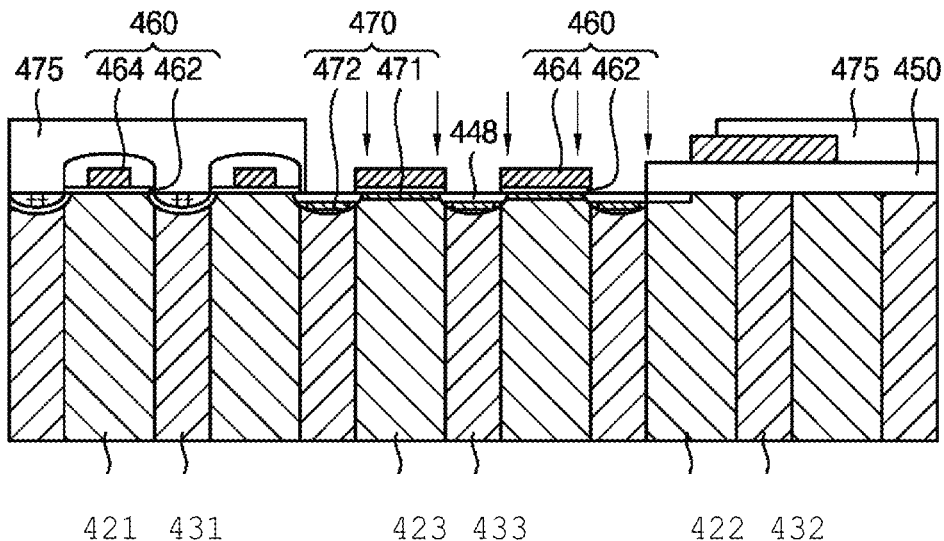

Referring to FIG. 11, ion implantation mask patterns 475 are formed on the active region AR and the peripheral region PR as ion implantation masks. A second ion implantation process is performed using the mask pattern 475 and the gate structure 460 formed on the transition region TR as an ion implantation mask. Accordingly, the reverse recovery layer 470 is formed in the transition region TR.

In this case, the reverse recovery layer 470 includes a first reverse recovery layer pattern 471 formed on the transition pillars and a second reverse recovery layer pattern 472 formed on the epitaxial layer. The first reverse recovery layer pattern 471 and the second reverse recovery layer pattern 472 have vertical heights different from each other. For example, the first reverse recovery layer pattern 471 is interposed between the gate structure and the epitaxial layer. In addition, the second reverse recovery layer pattern 472 is positioned between the gate structures adjacent to each other and on the transition pillars. In this case, the first reverse recovery layer pattern 471 has a vertical position higher than that of the second reverse recovery layer pattern 472. The first reverse recovery layer pattern 471 may be formed to have a shallow depth. Accordingly, as the first and second reverse recovery layer patterns 471 and 472 have different vertical heights, the reverse recovery layer 470 may have a step shape as a whole. As used throughout this disclosure, a step shape refers to the height difference between the portions of the reverse recovery layer 470 shown in FIG. 11 and similar such structures.

Further, the reverse recovery layer 470 may further include a third reverse recovery layer pattern 473 formed in the peripheral region PR. The third reverse recovery layer pattern 473 may be disposed under the field oxide layer 450 and over the epitaxial layer 422.

Meanwhile, by using the gate structure 460 as a mask for an ion implantation process, ions may be additionally implanted onto the P-body regions 446 in the active region AR to form a high concentration region 447 (FIG. 10).

Figure 12:
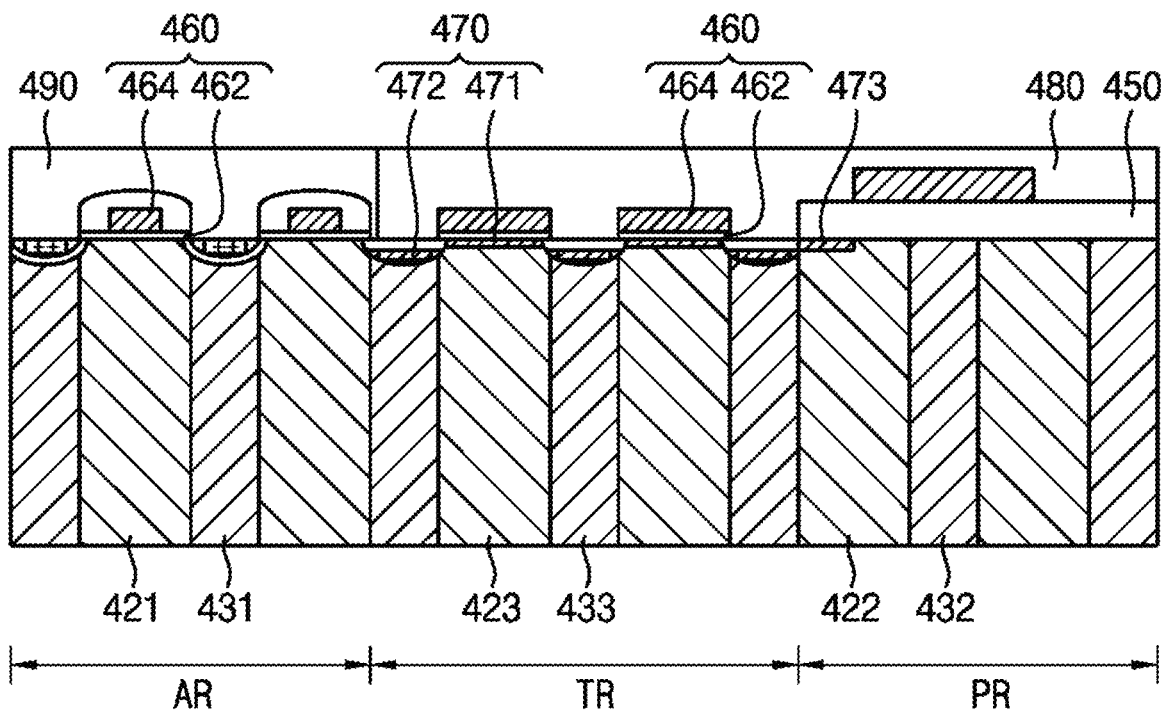

Referring to FIG. 12, an insulating interlayer 480 is formed through a deposition process and a reflow process. Thereafter, the insulating interlayer 480 and the gate oxide layer are patterned to expose the high concentration region 447. Thus, contact windows are formed.

Subsequently, a metal layer filling the contact openings is formed to form a source electrode. The source electrode may be connected to the pillars 431 through the high concentration regions 447 indicated in FIGS. 10-12 with plus signs. Meanwhile, an additional process may be performed to form a drain electrode on a rear surface of the substrate 405.

As described above, according to example embodiments of the super junction semiconductor device and the method for manufacturing the same according to the present invention, it is possible to effectively disperse the reverse recovery current while suppressing a decrease in an effective pillar length.

Although the super junction semiconductor device has been described with reference to the specific embodiments, they are not limited thereto. Therefore, it will be readily understood by those skilled in the art that various modifications and changes can be made thereto without departing from the spirit and scope of the appended claims.

The invention claimed is:

1. A super junction semiconductor device comprising:
   a substrate of a first conductive type, the substrate including an active region, a peripheral region surrounding the active region, and a transition region interposed between the active region and the peripheral region;
   an epitaxial layer disposed on the substrate, the epitaxial layer having a first conductive type;
   a plurality of pillars extending in a vertical direction and arranged within the epitaxial layer;
   gate structures disposed on the epitaxial layer in both the active region and the transition region, and each of the gate structures extending across the epitaxial layer and the pillars in a horizontal direction; and
   a reverse recovery layer of a second conductive type, the reverse recovery layer having a height in the vertical direction that is different as between on the pillars and on the epitaxial layer, the reverse recovery layer configured to dissipate a reverse recovery current in the transition layer,
   wherein the reverse recovery layer is not formed active region,
   the reverse recovery layer includes a first reverse recovery layer pattern formed under each of the gate structures and a second reverse recovery layer pattern formed between the gate structures, and
   the first recovery layer pattern has both an upper surface and a lower surface, each having a vertical height higher than that of the second reverse recovery layer pattern such that the reverse recovery layer has a step shape wherein the first and the second recovery layer pattern are not connected to each other.

2. The super junction semiconductor device of claim 1, further comprising a diffusion region having the second conductive type, covering the second reverse recovery layer pattern.

3. The super junction semiconductor device of claim 2, wherein the second reverse recovery layer pattern has a vertical depth lower than that of the diffusion region.

4. The super junction semiconductor device of claim 2, wherein the second reverse recovery layer pattern has an ion concentration higher than that of the diffusion region.

5. The super junction semiconductor device of claim 1, further comprising a field oxide layer disposed in the peripheral region, and wherein the reverse recovery layer further includes a third reverse recovery layer pattern formed in the peripheral region.

6. The super junction semiconductor device of claim 5, wherein the third reverse recovery layer pattern is disposed under both the field oxide layer and over the epitaxial layer.

7. A method of manufacturing a super junction semiconductor device comprising:

preparing a substrate having a first conductive type, the substrate including an active region, a peripheral region surrounding the active region and a transition region interposed between the active region and the peripheral region;

forming an epitaxial layer having the first conductive type on the substrate;

forming a plurality of pillars having a second conductive type, the pillars extending in a vertical direction, being formed inside of the epitaxial layer and being interleaved with the substrate in a horizontal direction;

forming a plurality of gate structures on the epitaxial layer in both the active region and the transition region, each of the gate structures extending in the horizontal direction to cross the epitaxial layer and the pillars; and performing an ion implanting process using the gate structures in the transition region as masks to form a reverse recovery layer of the second conductive type, the reverse recovery layer having vertical formation heights that are different as between on the pillars and on the epitaxial layer, the reverse recovery layer being configured to dissipate a reverse recovery current in the transition layer, wherein the reverse recovery layer is not formed in the active region, the reverse recovery layer includes a first reverse recovery layer pattern formed under each of the gate structures and a second reverse recovery layer pattern formed between the gate structures, and the first recovery layer pattern has both an upper surface and a lower surface, each having a vertical height higher than that of the second reverse recovery layer pattern such that the reverse recovery layer has a step shape wherein the first and the second recovery layer pattern are not connected to each other.

8. The method of claim 7, further comprising forming a field oxide layer in the peripheral region, and wherein the reverse recovery layer further includes a third reverse recovery layer pattern formed in the peripheral region.

9. The method of claim 8, wherein the third reverse recovery layer pattern is disposed under both the field oxide layer and over the epitaxial layer.

10. The method of claim 7, prior to forming the reverse recovery layer, further comprising forming a diffusion region having the second conductive type.

11. The method of claim 10, wherein the second reverse recovery layer pattern has a vertical depth lower than that of the diffusion region.

12. The method of claim 10, wherein the reverse recovery layer has an ion concentration higher than that of the diffusion region.

* * * * *